United States Patent [19]

Manzione et al.

[11] Patent Number: 5,195,023
[45] Date of Patent: Mar. 16, 1993

[54] INTEGRATED CIRCUIT PACKAGE WITH STRAIN RELIEF GROOVES

[75] Inventors: Louis T. Manzione; C. Kumar Patel, both of Summit, N.J.

[73] Assignee: AT&T Bell Laboratories, Murray Hill, N.J.

[21] Appl. No.: 812,555

[22] Filed: Dec. 23, 1991

[51] Int. Cl.⁵ .................... H05K 7/00; H01L 23/28
[52] U.S. Cl. .................................. 361/392; 257/629
[58] Field of Search ............... 357/72; D13/162, 182, D13/184; 361/392, 394

[56] References Cited

U.S. PATENT DOCUMENTS 4,887,149 12/1989 Romanó .................... 357/74 X

FOREIGN PATENT DOCUMENTS

| 59-61150 | 4/1984 | Japan | 357/72 |
| 61-90449 | 5/1986 | Japan | 357/72 |
| 62-81735 | 4/1987 | Japan | 361/383 |
| 63-32955 | 2/1988 | Japan | 357/72 |
| 1-220463 | 9/1989 | Japan | 357/72 |

Primary Examiner—Leo P. Picard
Assistant Examiner—Michael W. Phillips
Attorney, Agent, or Firm—P. V. D. Wilde

[57] ABSTRACT

As the size and consequent thickness of IC packages shrink bowing of the package due to differential contractions becomes a problem. The solution according to this invention is to mold strain relief grooves into the surface of the plastic package.

2 Claims, 2 Drawing Sheets

INTEGRATED CIRCUIT PACKAGE WITH STRAIN RELIEF GROOVES

BACKGROUND OF THE INVENTION

For most of the history of integrated circuit manufacture, chip sizes were standard, and the package for those chips was typified by a large dual-in-line package (DIP) having long leads for insertion through holes in printed wiring boards.

In recent years, integrated circuit packaging has changed significantly. Lead count has grown, and pitch correspondingly decreased. Leads are now typically designed for surface mount or solder bump mount.

While the size of the chips has generally increased, the dimensions of the overall package have decreased. Among the consequences of this trend is a problem of bowing of the package. Bowing causes distortion of the plane of the leads, and interferes with mounting of the package on a circuit board. Bowing of packages with solder bumps is particularly serious, and frequently renders the parts useless in planar assembly.

The cause of bowing in thin packages is differential thermal contraction between the chip and the plastic encapsulant. The flexural rigidity of the thin package is significantly less than the thicker ones. Hence, disparities in the coefficients of thermal expansion coefficients between the lead frame and the silicon die can cause far greater bowing. In addition, significant differences in thickness of encapsulant above and below the device are more common in thin packages and make matters worse. With thick packages of the prior art, flexural rigidity of the thicker plastic was sufficient to resist the stress.

SUMMARY OF THE INVENTION

According to the invention, stress relief is incorporated into plastic integrated circuit packages in the form of relief gaps. These typically take the form of scores or grooves molded into the plastic surface. In rectangular packages, scores along the longitudinal dimension will be effective in many cases, while in a typical quad package with a square outline scores may be provided in both dimensions to form a grid pattern. Many modifications of the approach can be envisioned.

BRIEF DESCRIPTION OF THE DRAWINGS

The invention may be better appreciated with the aid of the following detailed description in which.

DETAILED DESCRIPTION

Figure 1:
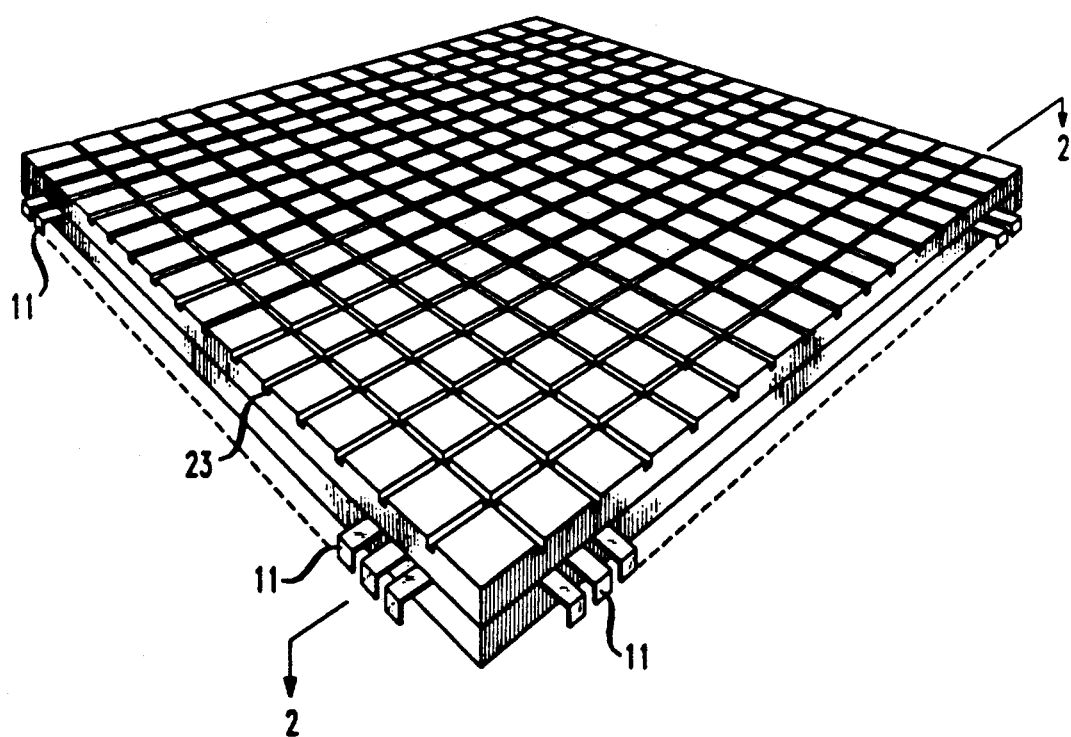
FIG. 1 is a plan view of an integrated circuit package showing a grid of relief gaps according to the invention.

Referring to FIG. 1, the plastic IC package shown generally as 1 includes surface mount leads 11 for mounting, and stress relief gaps 23. In this package bowing is as likely to occur in either lateral dimension of the package so it is beneficial to incorporate gaps along both major dimensions as shown. In some cases, e.g. in an elongated rectangular package, it may be sufficient to incorporate one or more gaps along only the major axis.

Figure 2:
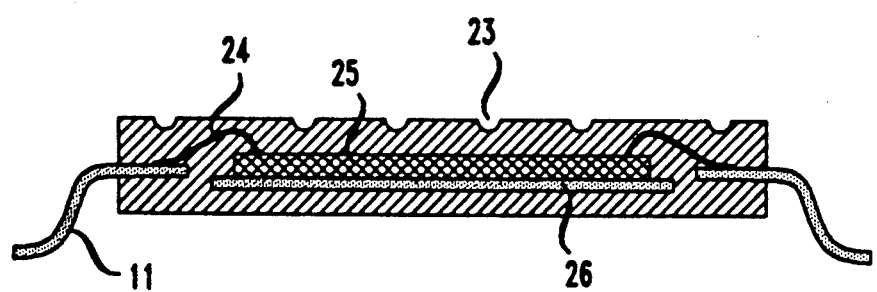
FIG. 2 is a section 2—2 through FIG. 1.

FIG. 2 shows a section view through FIG. 1. The chip is shown at 25, and stress relief gaps are designated 23. Surface mount leads are shown at 11. The structure of the leads is not part of the invention except in the sense that some package types are impaired more than others by the bowing problem. Although bowing does not necessarily affect the electrical performance of the device, deformation can strain and crack the passivation layer of the device leading to an accelerated moisture ingress and subsequent premature device failure. Thus a dual-in-line package may tolerate significant bowing as long as the leads protrude through the wiring board far enough to be effectively soldered. It will be evident to those skilled in the art that the package with standard surface mount leads will be more susceptible to problems of bowing, and solder bump packages least tolerant of all to bowing. In the embodiment shown in FIG. 2, the grooves effectively reduce the thickness of continuous molding compound above the die, thereby serving to reduce the shrinkage on the top half of the package. This approach is effective in relieving bowing caused by a thicker section of molding compound above the die. In this case, the silicon die and the metal pad have approximately the same coefficient of thermal expansion. There may be no die pad at all, and the die is simply suspended from the ends of the leads.

Figure 3:
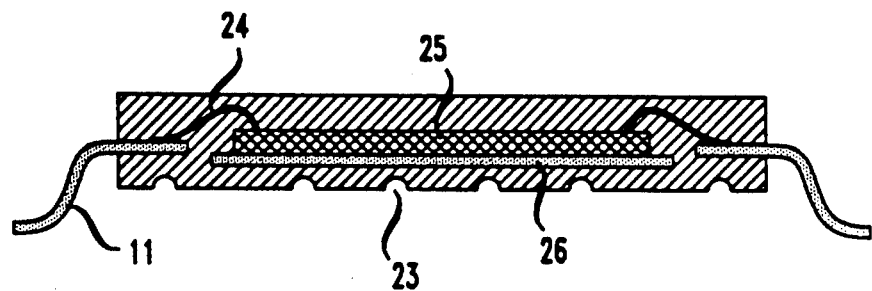
FIG. 3 shows a variation of the package design of FIG. 1.

Another cause of bowing is a significant difference in shrinkage between the silicon die, 25, and the metal die pad of the leadframe, 26. This situation is common when copper leadframes are used. In this case, the greater shrinkage of the copper leadframe will bow the package in the opposite direction, e.g. concave downward in FIG. 3. The grooves described herein can be used to alleviate this problem as well. Grooves are placed on the side of the package opposite the silicon die, 25, which would be on the bottom surface in FIG. 3, where they reduce the effective thickness of the continuous span of molding compound. Therefore, the shrinkage stresses in the top half of the package are greater and compensate for the bowing induced by the silicon die/die pad assembly. Although another solution would be to simply use a thin section of molding compound under the die pad, this configuration is very difficult to mold since there are large differences in the flow channel thickness, and therefore the flow resistance, above and below the die pad assembly. The grooves are preferable since they allow a thicker flow channel to be used over most of the package dimension, while deriving the benefits of thinner continuous span.

An added benefit with grooves is that they can physically position the die pad assembly by preventing it from being pushed downward by the leading flow front in the thicker section above the die. This avoids the common problem of pad shift which is far more serious in thin packages where the pressure forces to drive the molding compound into the thinner cavities are much greater. Grooves on both sides of the package would serve to ensure positioning when the direction of the pad shift forces is variable or unknown.

The depth of the gaps 23 needs to be substantial to be effective. Depressions in integrated circuit packages may have occurred in the prior art as artifacts of the molding process, or as embossed labels or markings. Such shallow depressions would not be effective to prevent bowing. It is therefore necessary to specify that the depth of the stress relieve gaps be a substantial fraction of the thickness above or below the device, e.g. greater than 20%, or even greater than 50% with packages especially susceptible to bowing problems. In general, the grooves need to be deep enough to reduce the thickness of the continuous section then needed to balance the shrinkage forces.

The kind of plastic encapsulant used is generally independent of the bowing problem and solution described here. The coefficient of thermal expansion of all commonly used plastic materials is sufficiently different from that of the semiconductor materials and die support pads typically used for IC chips that bowing will be unavoidable in many package designs.

Figure 4:
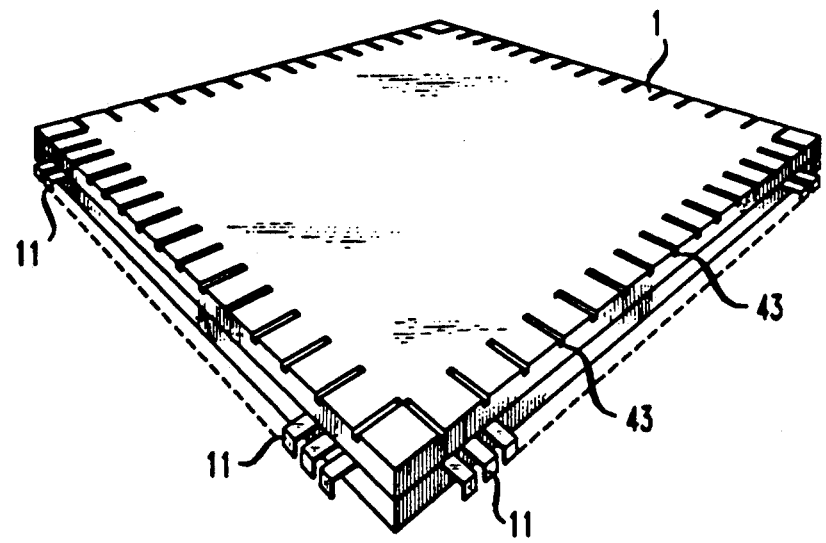
FIG. 4 is a perspective view of a preferred embodiment of the invention.

A parameter that is generally important in the context of the invention is the thickness of the plastic package. As indicated above bowing is usually not a problem with thick packages because the die and die pad are positioned near the center line more easily, and the package has greater flexural rigidity to resist bowing. It becomes a problem when the thickness of the package falls below about 2 mm. In such packages, the overhead is limited. Therefore, it may be necessary to carefully locate the grooves with respect to, for instance, wire bonds in the package. In FIG. 2, a wire bond is shown at 24, and the grooves 23 are positioned intentionally to avoid the wire bond. If it is necessary to design the pattern of stress relief grooves to position them with respect to internal features of the package, the pattern may depart from simple symmetrical groove or grid patterns. Circular patterns may be effective in some cases. Grooves incorporated only along the edges of the package, i.e. high stress regions, may be suitable. This configuration, with the partial grooves designated 43, is shown in FIG. 4, and in some cases may be a preferred embodiment of the invention. It is evident in the Figure that the grooves do not intersect one another. Optimum spacing between grooves will depend on many factors and may be determined empirically. For an IC package like that shown in FIG. 1, having e.g. length and width of 25 mm., grooves spaced at 5 mm or less would normally be effective. Groove width is also a variable of choice and will depend inter alia on molding considerations. Semicircular grooves provides the lowest flow resistance. Grooves of the order of 0.5 mm in width will serve in most cases.

An important consideration in IC packages is heat dissipation. The presence of grooves in the plastic increases the surface area of the package, and improves the rate of heat flow to the surrounding ambient.

Grooves in the surface of the package can also serve as fiducial marks during placement of the package in the mounting operation. Automated pick and place tools are commonly used in this operation, and a grid or array of grooves in the surface of the package can aid in alignment and control.

Various additional modifications and deviations of the invention just described will occur to those skilled in the art. All such variations that rely basically on the principles described should be considered within the spirit and scope of this invention. For example similarly effective strain relief against bowing may be obtained with an inverted groove structure i.e. a ribbed structure.

We claim:

1. An improved plastic integrated circuit package comprising an integrated circuit chip encapsulated in a plastic encapsulant to form an integrated circuit package, the package formed with top and bottom major surfaces and having the integrated circuit chip centered within the edges of the encapsulant and approximately centered between the top and bottom major surfaces, wherein the improvement comprises a plurality of grooves formed in at least one of said major surfaces, said grooves extending from at least one of said edges of said package only part of the way across the major surface toward an edge opposite said at least one of said edges of the package leaving the central portion of the surface free of grooves, said grooves having a depth of at least 20% of the distance measured from the major surface in which the grooves are formed to the integrated circuit chip.

2. The integrated circuit package of claim 1 further comprising four edges wherein grooves extend from all four said edges of the package, and wherein grooves from adjacent edges do not intersect one another.

* * * * *